United States Patent
Parisi et al.

(10) Patent No.: US 11,611,280 B2
(45) Date of Patent: Mar. 21, 2023

(54) GALVANICALLY ISOLATED DC-DC CIRCUIT CONVERTER WITH DATA COMMUNICATION, CORRESPONDING SYSTEM AND CORRESPONDING METHOD

(71) Applicant: STMicroelectronics S.r.l., Agrate Brianza (IT)

(72) Inventors: Alessandro Parisi, Mascalucia (IT); Nunzio Greco, Camporotondo Etneo (IT); Nunzio Spina, Catania (IT); Egidio Ragonese, Aci Catena (IT); Giuseppe Palmisano, S. Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/404,382

(22) Filed: Aug. 17, 2021

(65) Prior Publication Data
US 2021/0376735 A1    Dec. 2, 2021

Related U.S. Application Data

(63) Continuation of application No. 16/748,328, filed on Jan. 21, 2020, now Pat. No. 11,128,221, which is a
(Continued)

(30) Foreign Application Priority Data

Jan. 12, 2018    (IT) .................. 102018000000830

(51) Int. Cl.
*H02M 3/335*    (2006.01)
*H02M 1/08*    (2006.01)
(Continued)

(52) U.S. Cl.
CPC ........ *H02M 3/33523* (2013.01); *H01F 19/08* (2013.01); *H01F 27/2804* (2013.01);
(Continued)

(58) Field of Classification Search
None
See application file for complete search history.

(56) References Cited

U.S. PATENT DOCUMENTS

| 4,956,579 A | 9/1990 | Albright |
| 5,349,523 A | 9/1994 | Inou et al. |
(Continued)

FOREIGN PATENT DOCUMENTS

| CN | 101453268 A | 6/2009 |
| CN | 101926081 A | 12/2010 |
(Continued)

OTHER PUBLICATIONS

Ragonese et al., "A fully Integrated Galvanically Isolated DC-DC Converter with Data Communication", 2017 IEEE (Year: 2017).*
(Continued)

*Primary Examiner* — Jeffrey A Gblende
(74) *Attorney, Agent, or Firm* — Crowe & Dunlevy

(57) ABSTRACT

A DC-DC converter includes: an transformer having a primary winding and a secondary winding magnetically coupled to the primary winding; a power oscillator applying an oscillating signal to the primary to transmit a power signal to the secondary winding; a rectifier connected to the secondary winding of the transformer to obtain an output DC voltage by rectification of the power signal; comparison circuitry to generate an error signal representing a difference between the output DC voltage and a reference voltage; a transmitter connected to the secondary winding of the transformer to apply an amplitude modulation to the power signal at the secondary winding of the transformer in response to
(Continued)

the error signal to thereby produce an amplitude modulated signal at the primary winding; and a receiver and control circuit connected to the primary winding to control an amplitude of the oscillating signal as a function of the amplitude modulated signal.

25 Claims, 6 Drawing Sheets

Related U.S. Application Data continuation of application No. 16/244,272, filed on Jan. 10, 2019, now Pat. No. 10,637,360.

(51) Int. Cl.
| | | |
|---|---|---|
| *H04L 27/08* | (2006.01) | |
| *H01F 19/08* | (2006.01) | |
| *H01F 27/28* | (2006.01) | |
| *H03B 5/12* | (2006.01) | |
| *H02M 3/338* | (2006.01) | |
| *H02M 3/337* | (2006.01) | |
| *H02M 3/00* | (2006.01) | |

(52) U.S. Cl.
CPC ............ *H02M 1/08* (2013.01); *H02M 3/337* (2013.01); *H02M 3/338* (2013.01); *H02M 3/33507* (2013.01); *H02M 3/33515* (2013.01); *H02M 3/33592* (2013.01); *H03B 5/1215* (2013.01); *H03B 5/1228* (2013.01); *H04L 27/08* (2013.01); *H01F 2019/085* (2013.01); *H02M 3/01* (2021.05)

(56) References Cited

U.S. PATENT DOCUMENTS

| | | |
|---|---|---|
| 6,658,051 B1 | 12/2003 | Liu |
| 7,489,526 B2 | 2/2009 | Chen et al. |
| 9,306,614 B2 | 4/2016 | Ragonese et al. |
| 9,685,871 B2 | 6/2017 | Takahashi et al. |
| 9,812,989 B1 | 11/2017 | Dupuis |
| 9,972,196 B2 | 5/2018 | Mueck |
| 2002/0057584 A1 | 5/2002 | Brockmann |
| 2003/0215020 A1 | 11/2003 | Dong et al. |
| 2004/0037094 A1 | 2/2004 | Muegge et al. |
| 2004/0239487 A1 | 12/2004 | Hershbarger |
| 2005/0162874 A1 | 7/2005 | Umetsu |
| 2006/0120115 A1 | 6/2006 | Chen et al. |
| 2007/0014371 A1 | 1/2007 | Fukahori et al. |
| 2007/0064358 A1 | 3/2007 | Murata et al. |
| 2007/0164720 A1 | 7/2007 | Lalithambika et al. |
| 2009/0184754 A1 | 7/2009 | Chen |
| 2010/0052630 A1 | 3/2010 | Chen |
| 2012/0245649 A1 | 9/2012 | Bohor et al. |
| 2015/0015156 A1 | 1/2015 | Angelin et al. |
| 2015/0109831 A1 | 4/2015 | Ohashi |
| 2015/0180528 A1 | 6/2015 | Ragonese et al. |
| 2015/0326127 A1 | 11/2015 | Peng et al. |
| 2015/0364249 A1 | 12/2015 | Palumbo et al. |
| 2016/0373014 A1 | 12/2016 | Pflaum |
| 2017/0070354 A1 | 3/2017 | Ragonese et al. |
| 2017/0358993 A1 | 12/2017 | Ragonese et al. |
| 2018/0062678 A1* | 3/2018 | Ragonese ........... H03F 3/45632 |

FOREIGN PATENT DOCUMENTS

| | | |
|---|---|---|
| CN | 106257813 A | 12/2016 |
| EP | 2814177 A1 | 12/2014 |
| EP | 3291446 A1 | 3/2018 |

OTHER PUBLICATIONS

Tan et al., "A Fully Isolated Delta-Signma ADC for Shunt Based Current Sensing", 2016 IEEE (Year: 2016).*
Baoxiling Chen, "Isolated half-bridge gate driver with integrated high-side supply", Power Electronics Specialists Conference, 2008. PESC 2008. IEEE.
Baoxing Chen "iCoupler® Products with isoPower™ Technology: Signal and Power Transfer Across Isolation Barrier Using Microtransformers", www.analog.com, 4 pages.
Chen: "Fully Integrated Isolated DC-DC Converter Using Micro Transformers," Proc. IEEE Applied Power Electronics Conference and Exposition, (APEC), pp. 335-338, Feb. 2008.
Chen: "Microtransformer Isolation Benefits Digital Control," Power Electronics Technology, pp. 20 25, Oct. 2008.
E. Ragonese, N. Spina, A. Castorina, P. Lombardo, N. Greco, A. Parisi, and G.Palmisano, "A fully integrated galvanically isolated DC-DC converter with data communication," IEEE Trans. Circuits Syst. I: Regular Papers, Early access.
F. Pulvirenti, G. Cantone, G. Lombardo, M. Minieri, "Dispositivi con isolamento galvanico integrate (in Italian)", in Convegno Annuale 2014 dalla ricerca all'impresa: necessità di un trasferimento più efficace, Trieste, Sep. 2014.
Greco et al: "A Galvanically Isolated DC-DC Converter Based on Current-Reuse Hybrid-Coupled Oscillators," IEEE Trans. Circuits Syst. II, early access Mar. 2016 (5 pages).
IT Search Report and Written Opinion for IT Appl. No. 102018000000830 dated Oct. 4, 2018 (10 pages).
Lombardo et al: "A Fully-Integrated Half-Duplex Data/Power Transfer System With Up to 40Mbps Data Rate, 23mW Output Power and On-Chip 5kV Galvanic Isolation," IEEE International Solid-State Circuits Conference (ISSCC), San Francisco, USA, Feb. 2016, pp. 300-301.
Marwat, Saleem: "Digital Isolators Compliance to IEC 61010-1 Edition 3.0 Safety Requirements," Texas Instruments, White Paper, Jan. 2014, SLYY055 (5 pages).
Spina, et al: "Current-Reuse Transformer Coupled Oscillators With Output Power Combining for Galvanically Isolated Power Transfer Systems," IEEE Transaction on Circuits and Systems I, vol. 62, pp. 2940-2948, Dec. 2015.
Z. Tan et al., "A fully isolated delta-sigma ADC for shunt based current sensing," IEEE Journal of Solid-State Circuits, vol. 51, Oct. 2016, pp. 2232-2240.
First Office Action for co-pending EP Appl. No. 18215990.5 dated Feb. 12, 2020 (6 pages).
First Office Action and Search Report for co-pending CN Appl. No. 201910028721.6 dated Jun. 29, 2020 (10 pages).
Second Office Action and Search Report for co-pending CN Appl. No. 201910028721.6 dated Feb. 22, 2021 (7 pages).
Intent to Grant for counterpart EP Appl. 18215990.5, report dated Sep. 12, 2022, 44 pgs.

* cited by examiner

GALVANICALLY ISOLATED DC-DC CIRCUIT CONVERTER WITH DATA COMMUNICATION, CORRESPONDING SYSTEM AND CORRESPONDING METHOD

PRIORITY CLAIM

This application is a continuation of U.S. patent application Ser. No. 16/748,328, filed on Jan. 21, 2020, which is a continuation of U.S. patent application Ser. No. 16/244,272, now U.S. Pat. No. 10,637,360, which claims the priority benefit of Italian Application for Patent No. 102018000000830, filed on Jan. 12, 2018, the contents of all of which are hereby incorporated by reference in their entireties to the maximum extent allowable by law.

TECHNICAL FIELD

The description relates to galvanically isolated DC-DC converter circuits.

One or more embodiments may apply to an embodiment with an isolation transformer manufactured on a stand-alone chip using a dedicated process.

One or more embodiments may apply to an embodiment with an isolation transformer manufactured on a chip of including an oscillator of the converter with an integrated approach.

BACKGROUND

A large number of applications require transferring power and data through a galvanic isolation barrier of several kilovolts.

Applications of such systems are in several fields such as industrial (e.g., high-side gate drivers), medical (e.g., implantable devices), isolated sensor interfaces, and lighting. The industry standard VDE 0884-10 has been developed to expressly take into account the availability of highly integrated semiconductor isolators with micro-scale isolation barriers, either using magnetic or capacitive transfer techniques. Either post-processed or integrated isolation capacitors can be adopted to perform galvanically isolated data communication.

Commercial isolated DC-DC converters typically adopt post-processed isolation transformers by using an architecture which includes: an isolated link for the power transmission (isolated power channel), which typically includes a VHF power oscillator, an isolation transformer, and a power rectifier; a further isolated link for the feedback path used to control the output power (typically by a PWM modulation of the power oscillator); and a plurality of dedicated isolated links, each one respectively for one of the data channels.

These architectures require at least three isolation transformers, one for the power channel, one for the feedback control channel, and one for the data channel.

There is a need in the art to address the drawbacks of prior implementations, by facilitating regulation of the power while maintaining a single channel through the galvanic isolation barrier.

SUMMARY

Disclosed herein is a DC-DC converter circuit, including: a single isolation transformer having a primary winding and a secondary winding magnetically coupled to the primary winding; a power oscillator connected to apply an oscillating signal to the primary winding of the single isolation transformer to thereby transmit a power signal, via the magnetic coupling, to the secondary winding; a rectifier connected to the secondary winding of the single isolation transformer and configured to obtain an output DC voltage by rectification of the power signal at the secondary winding; comparison circuitry configured to generate an error signal representing a difference between the output DC voltage and a reference voltage value; a transmitter connected to the secondary winding of the single isolation transformer to apply an amplitude modulation to the power signal at the secondary winding of the single isolation transformer in response to the error signal to thereby produce, via the magnetic coupling, an amplitude modulated signal at the primary winding; and a receiver and control circuit connected to the primary winding and configured to control an amplitude of the oscillating signal as a function of the amplitude modulated signal.

The magnetic coupling between the primary winding and the secondary winding may be between immediately adjacent portions of the primary winding and the secondary winding. The power oscillator may transmit the power signal, via the magnetic coupling, from the primary winding to the immediately adjacent portion of the secondary winding. The transmitter may apply the amplitude modulation from the secondary winding to produce, via the magnetic coupling, the amplitude modulated signal at the immediately adjacent portion of the primary winding.

The secondary winding may have first and second terminals. The transmitter may have first and second terminals; and wherein the first terminal of the transmitter is directly electrically connected to the first terminal of the secondary winding, and the second terminal of the transmitter is directly electrically connected to the second terminal of the secondary winding.

The primary winding may have first and second terminals. The receiver and control circuit may have first and second terminals. The first terminal of the receiver and control circuit may be directly electrically connected to the first terminal of the primary winding, and the second terminal of the receiver and control circuit may be directly electrically connected to the second terminal of the primary winding.

The secondary winding may include first and second coils directly electrically connected in series.

A common mode transient (CMT) rejection circuit may be connected between the primary winding and the receiver and control circuit, the CMT rejection circuit being configured to reduce effects of common mode transients in the amplitude modulated signal.

The CMT rejection circuit may include: a first n-channel transistor having a drain coupled to a first node, a source coupled to a second node, and a gate coupled to the primary winding; a second n-channel transistor having a drain coupled to a third node, a source coupled to the second node, and a gate coupled to the primary winding; a resistance coupled between the first node and the third node; a capacitance coupled between the first node and the third node; an inductance coupled between the first node and the third node; and a tail coupled between the second node and ground. A tap of the capacitance and a tap of the inductance may be coupled to a supply voltage, and the first node and the third node may be coupled to the receiver.

The tail may include a current sink.

A de-multiplexing circuit may be coupled to the receiver and control circuit, and configured to produce, based upon the amplitude modulated signal, n-data channels representing data transmitted by the transmitter.

One of the n-data channels may be a power control bit stream responsive to a difference between the output DC voltage and a reference signal.

A digital to analog converter may be configured to convert the power control bit stream to a regulation voltage for the power oscillator, and the power signal transmitted by the power oscillator may be based upon the regulation voltage.

An analog to digital converter may be configured to convert the error signal to a power control value, and a multiplexer may receive as input the power control value and data to be transmitted and may output therefrom a stream of data as the power control value and data to be transmitted from the transmitter to the receiver in a multiplexed fashion.

A switch arrangement may feed a given digital value to the multiplexer under control of a timing signal based on a reference clock signal. A corresponding switch arrangement may feed the given digital value to a circuit arrangement performing a reset of the de-multiplexing circuit based upon occurrence of the given digital value in the stream of data, the timing signal identifying a clock training phase to synchronize the multiplexer and demultiplexer.

The analog to digital converter may be a pulse width modulation (PWM) generator generating a PWM output signal that is sampled and multiplexed with the stream of data.

The digital to analog converter may include a filter configured to extract a DC component from the PWM output signal, the DC component serving to regulate power transmitted by the power oscillator.

The single isolation transformer may be integrated within a dedicated stand-alone chip.

The single isolation transformer may be within a same chip as the power oscillator.

The power oscillator may include a cross-coupled pair of transistors connected to a bias regulating circuit for regulating biasing of the cross-coupled pair of transistors, the bias regulating circuit including a bias MOSFET configured to provide a bias current for operation of the power oscillator under control of a bias voltage and a regulation MOSFET configured to adjust the bias current.

Also disclosed herein is a DC-DC converter circuit, including: an isolation transformer having a primary winding and a secondary winding magnetically coupled to the primary winding; wherein the primary winding comprises first and second primary coils directly electrically connected in series, with a tap between the first and second primary coils being coupled to a supply voltage; wherein the secondary winding comprised first and second secondary coils directly electrically connected in series, with a tap between the first and second secondary coils being coupled to a ground voltage; a power oscillator connected to apply an oscillating signal to the primary winding of the isolation transformer to thereby transmit a power signal to the secondary winding; a rectifier connected to the secondary winding of the isolation transformer and configured to obtain an output DC voltage by rectification of the power signal at the secondary winding; comparison circuitry configured to generate an error signal representing a difference between the output DC voltage and a reference voltage value; a transmitter connected to the secondary winding of the isolation transformer to apply an amplitude modulation to the power signal at the secondary winding of the isolation transformer in response to the error signal to thereby produce an amplitude modulated signal at the primary winding; and a receiver and control circuit connected to the primary winding and configured to control an amplitude of the oscillating signal as a function of the amplitude modulated signal.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of the instant description. The embodiments may be obtained by one or more of the specific details or with other methods, components, materials, and so on. In other cases, known structures, materials or operations are not illustrated or described in detail so that certain aspects of embodiment will not be obscured.

Reference to "an embodiment" or "one embodiment" in the framework of the present description is intended to indicate a particular configuration, structure, characteristic described in relation to the embodiment is compliance in at least one embodiment. Hence, phrases such as "in an embodiment" or "in one (or more) embodiments" that may be present in one or more points in the present description do not necessarily refer to one and the same embodiment. Moreover, particular conformation, structures or characteristics as exemplified in connection with any of the figures may be combined in any other way in one or more embodiments as possibly exemplified in other figures.

The references used herein are provided merely for convenience and hence do not define the extent of protection or the scope of the embodiments.

Throughout this description reference will be made to various documents. Captions to these documents will include a number between square parentheses (e.g. [X]), where the number between square parentheses is the number which identifies the captioned document in the LIST OF REFERENCES CITED IN THE DESCRIPTION reproduced at the end of this description.

Figure 1:
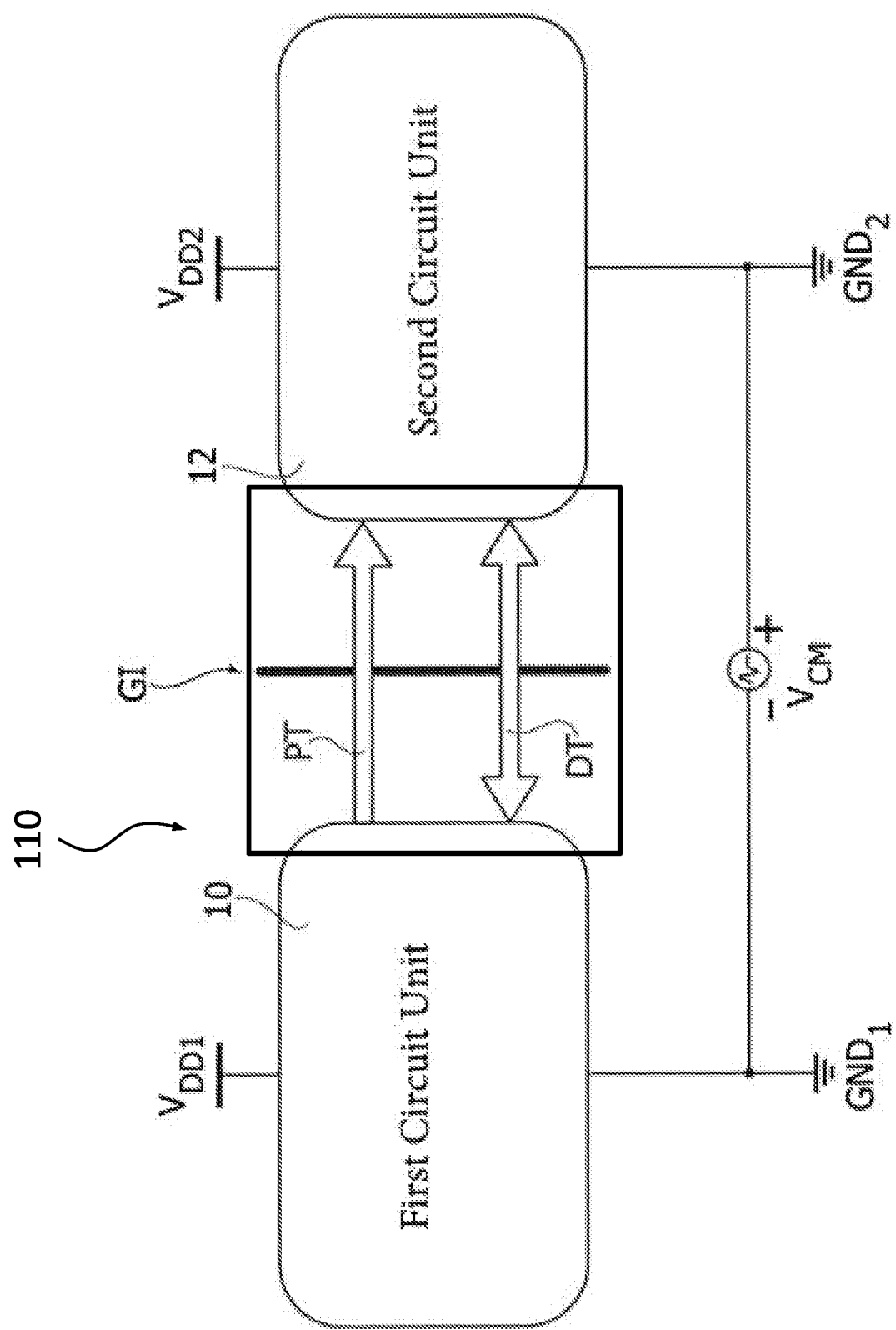
FIG. 1 is an exemplary representation of a possible context of use of embodiments of DC-DC converter circuits disclosed herein.

One or more embodiments may provide a DC-DC converter circuit 110 with a (galvanic) isolation barrier GI in a system having the general layout exemplified in FIG. 1, namely a system including a first unit 10 and a second unit 12 having respective supply lines $V_{DD1}$, $V_{DD2}$ and grounds $GND_1$ and $GND_2$. A common mode signal $V_{CM}$ may be established between the two grounds $GND_1$ and $GND_2$ which may be exposed to ground shifts and thus to transients or CMTs (e.g., $dV_{CM}/dt$).

One or more embodiments may apply to systems where power transfer PT is provided from the unit 10 through a converter circuit to the unit 12 while bidirectional data transfer DT may occur between the unit 10 and the unit 12.

Human/data interfaces, bus/network controllers, including microcontroller units (μCUs) may be exemplary of units 10.

Sensor interfaces, gate drivers, medical equipment, and communication network devices may be exemplary of units 12.

Either post-processed or integrated isolation capacitors can be used in providing galvanically isolated data communication [1]. Capacitive isolators may use a two-chip approach (i.e., RX and TX), exploiting either RF amplitude modulation or pulsed transmission. However, capacitive isolator techniques may not be able to provide power transfer due to the detrimental voltage partition at the input of power rectifier and consequent degradation of power efficiency, especially when high galvanic isolation is desired.

Transformer-based isolators can also be used for data transmission. Isolation transformers may be implemented by post-processing steps [2].

Post-processed isolation transformers may also be exploited for high-efficiency power transfer [3]-[5] by using a dedicated link formed by a power oscillator (i.e., the DC-AC converter) and a rectifier (i.e., the AC-DC converter).

Certain integrated transformers capable of sustaining several kilovolts have been also developed [6]. Based on this technology, galvanically isolated data transfer systems were made available [7], while high-efficiency power transfer has been recently demonstrated [8]-[11].

The main advantages and drawbacks of various different isolation approaches are summarized in the following table.

| Isolation approaches | Main features | Drawbacks |
| --- | --- | --- |
| Integrated capacitors | On-chip galvanic isolation Data transfer available | Trade-off in terms of cost/area and isolation CMT additional circuitry to be used |
| Post-processed transformer | Data and power transfer available High CMT immunity for data transfer High galvanic isolation rating | Low level of integration Efficiency degradation at high isolation rating |
| Integrated transformers | On-chip galvanic isolation Data transfer products High CMT immunity for data transfer Power transfer demonstrated | Limited isolation rating due to oxide thickness |

Commercial isolated DC-DC converters typically adopt post-processed isolation transformers by using an architecture which includes: an isolated link for the power transmission (isolated power channel), which is typically formed from a VHF power oscillator, an isolation transformer and a power rectifier; a further isolated link for the feedback path used to control the output power (typically by a PWM modulation of the power oscillator); and a plurality of dedicated isolated links, one for each data channel.

These architectures use at least three isolation transformers, one for the power channel, one for the feedback control channel and one for the data channel.

An alternative architecture for an isolated DC-DC converter is shown in U.S. Pat. No. 9,306,614 [12]. The main idea is to also use the isolated power channel for a bidirectional (half-duplex) data communication by an ASK modulation of the power signal at the primary or the secondary windings of the isolation transformer. Proper demodulation circuitries are included to recover data and clock bit stream on both the first and second interfaces.

In this application, however, a variable power functionality is not compatible with data transmission implemented by ASK modulation on the power channel. Also, data communication utilizes the presence of the power signal and this is not compatible with typical power control that exploits an on/off modulation (i.e., PWM modulation, Bang-Bang control scheme) of the power oscillator to preserve efficiency. Thus, such an implementation cannot be used when a variable/controlled output power is desired. Therefore, an output voltage regulator would be used.

Also, inherent CMT rejection performance is poor. To transfer power with good efficiency involves large isolation power transformers and hence high parasitic capacitances between primary and secondary windings of the isolation transformer. This is against the desire for a high CMT rejection because the injected currents due to CMTs are proportional to parasitic primary-to-secondary capacitances (i.e. I=C dV/dt).

However, in several applications, along with power and data transmission, the regulation of the transmitted power is to be used. A possible implementation uses two separated isolated channels as shown in the publication of Z. Tan et al., "A fully isolated delta-sigma ADC for shunt based current sensing," IEEE Journal of Solid-State Circuits, vol. 51, October 2016 [13]. In the architecture there discussed, a first isolated channel is used for a power transmission and a second channel for data and power control feedback transmission. Moreover, micro-transformers are used to implement the two galvanically isolated links.

However, this implementation brings with it a high occupation area with higher cost because at least two separated isolated links are used to transfer regulated power and data. Two isolation transformers are used to help guarantee an isolated and regulated DC-DC conversion together with a high speed data transmission. These architectures use a multichip implementation (also 5-6 chips) in which the two isolation components generally occupy a large area. There is an increase in the complexity of the system in package and therefore at a higher cost. Furthermore, the presence of two isolated channels can produce a cross-talk phenomena that hinders data communication.

Given the state-of-the-art of isolated DC-DC converters with data communication, it is clear that reducing the number of isolated links would represent an important advance in terms of size and costs. Of course, this has to be implemented without significantly affecting the overall performance of the converter. The architecture disclosed herein uses only one isolated link to transfer power and n-channels data multiplexed with the power control signal, thus overcoming the drawbacks of conventional designs.

For the sake of simplicity and ease of understanding, the preceding description was provided with reference to embodiments wherein the first unit 10 and the second unit 12 include a transmitter 118 and a receiver 120, with data transmission DT assumed to take place (uni-directionally) from the transmitter 118 to the receiver 120. The transmitter 118 and receiver 120 are included in a galvanically isolated DC-DC converter 110 with data transmission using an isolated link to transfer power with high efficiency and a feedback link to control the output DC voltage and further support a data communication channel.

Figure 2:
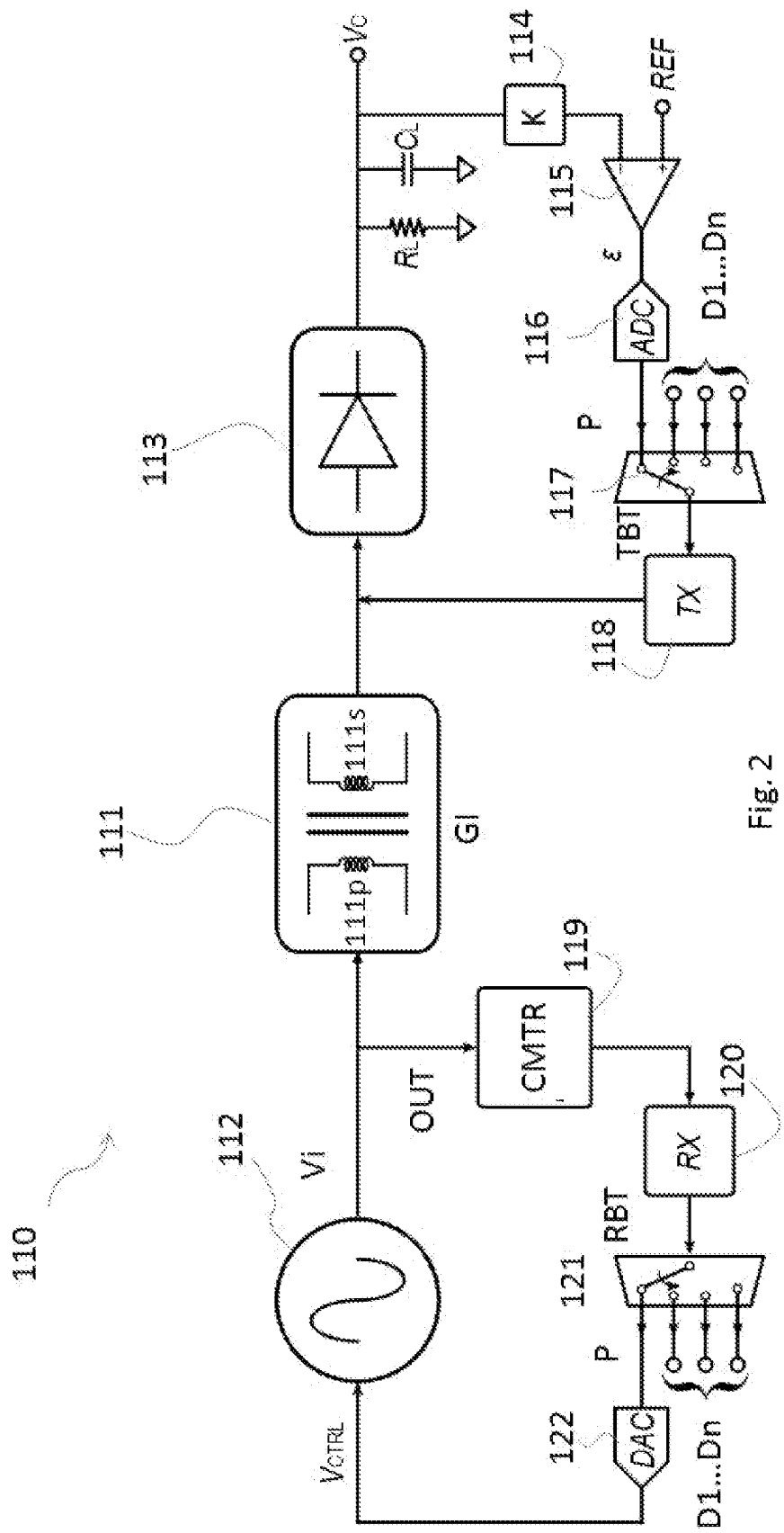
FIG. 2 is a block diagram of an embodiment of a DC-DC converter.

Thus, one or more embodiments may provide: a second unit 12 comprising a transmitter 118, as shown in FIG. 2 described in the following, for transmitting signals over a carrier DT; a first unit 10 comprising a receiver 120 for receiving the signals over a carrier DT transmitted by the transmitter 118; and a converter circuit 110 set between the transmitter 118 and the receiver 120, in particular comprising the transmitter 118 and the receiver 120, providing a galvanically isolated transmission channel for the signals over a carrier DT between the transmitter 118 and the receiver 120.

FIG. 2 is a block diagram showing a general implementation of the galvanically isolated DC-DC converter circuit 110 with data transmission using an isolated link to transfer power and a feedback link to control the output DC voltage and further support a data communication channel.

With the numerical reference 112 is indicated a power oscillator included in the converter circuit 110, which outputs an alternating current voltage $V_i$, the amplitude of which is regulated by a control voltage $V_{CTRL}$. The alternating current voltage $V_i$ is supplied to a first, primary, winding 111p of an isolation transformer 111 which represents a galvanic isolation barrier. A secondary winding 111s is connected to a rectifier 113, the output of which, through an output filter $R_L$, $C_L$, forms a DC output voltage $V_o$. Thus, the galvanic isolation barrier is implemented by an isolation transformer 111 used for the power transfer, according to the scheme based on a power oscillator 112 and a rectifier 113.

The output voltage $V_o$ is picked up by a partition circuit 114 which feeds a comparator 115, which receives at its other input a reference voltage REF. In this way, the output DC voltage $V_o$, obtained by rectification at rectifier 113 of the received power AC signal, is compared with the reference voltage, REF, and produces an error signal, ε.

The error signal E is then converted into a digital word, which represents a digital power control value P, by an analog to digital converter 116 and fed to an input of a multiplexer 117, which receives at its other inputs n data streams D1, D2, Dn, forming the n-channel data. The multiplexer produces at its output a bitstream TBT, in which the power control value P and the data streams D1, D2 . . . Dn are multiplexed. The bit stream TBT output by the multiplexer 117 is used to drive a modulation transmitter 118 which is configured to apply an amplitude modulation to the AC power signal, specifically an ASK (Amplitude Shift Keying) modulation, at the second winding 111s of the isolation transformer 111 by a load mismatch. Thus, data transmission is implemented by a transmitter circuit performing an amplitude modulation of the power signal at the secondary winding by means of a load mismatch.

In particular, the transmitter 118, as better detailed with reference to FIG. 5, includes a modulator 118b, implemented by NMOS switches, which shunt to ground two detuning capacitors, connected to the two ends of the secondary winding 111s, under the control of a signal supplied by an encoder 118a. These capacitors are used to detune the secondary winding 111s of the isolation transformer 111, i.e. they change the reactive part of the impedance (as happens with the backscattering in a RFID), thus producing an amplitude modulation at the primary winding 111p, indicated as OUT. Such amplitude modulation OUT is received at the first winding through a CMT (Common Mode Transient) rejection circuit (CMTR) 119, which reduces the effects of the CMT, and is then sent to a receiver 120, which is configured to demodulate the ASK modulated signal, i.e., amplitude modulation OUT, obtaining a received bitstream RBT. The received bitstream RBT is then demultiplexed by a demultiplexer 121, so that at its outputs are present a power control channel on which a stream of power control value P is transmitted and the n-data channels D1 . . . Dn.

Figure 6:
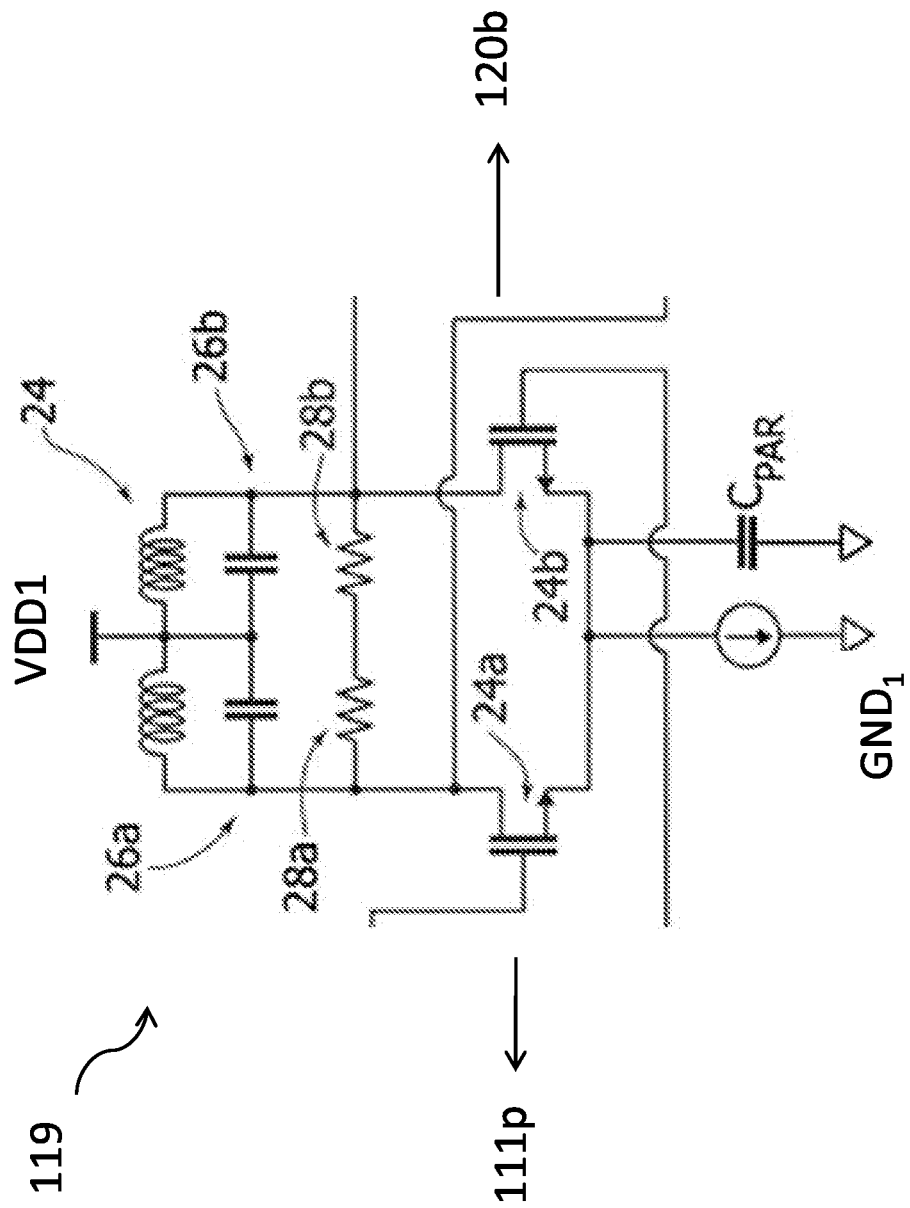
FIG. 6 is a block diagram of an embodiment of a common mode transient rejection circuit such as may be used in embodiments of DC-DC converters herein.

In one or more embodiments, as shown in FIG. 6 which provides details, the CMT rejection circuit 119 corresponds to the CMT circuit shown in documents [14], [15], [16]. In particular, the CMT rejection circuit 119 is configured to implement CMT filtering by a pass-band amplifier stage 24 including a differential amplifier stage—e.g. transistors 24a, 24b such as FETs—with an (optionally symmetrical) LC resonant load 26a, 26b.

In one or more embodiments, the LC filter in the resonant load 26a, 26b may be tuned at a data carrier frequency as used for the (e.g. RF amplitude modulation —ASK) transmission DT, thus rejecting common-mode noise while allowing data transmission.

In one or more embodiments, the LC filter in the stage 24 may provide a high Q-factor for common-mode signals to better reject common-mode noise, while resistors 28a, 28b may be provided in order to reduce the Q-factor for differential signals to be compliant with data bit rate.

It was noted that the common-mode rejection ratio (CMRR) of a simple differential pair (e.g. 24a, 24b) without the LC resonant load 26a, 26b, 28a, 28b may be reduced at high frequencies due to the parasitic capacitance $C_{PAR}$ (e.g. at the FET sources).

Differently from certain conventional solutions, in one or more embodiments as exemplified herein, the CMTI may be independent of data rate. Moreover, current consumption may be controlled, which may be advantageous in increasing power efficiency.

Coming back to the general schematics of the converter circuit 110 in FIG. 2, the power control channel, i.e. the channel carrying the power control bits P, is supplied to a digital to analog converter 122 which converts the power control P bit stream to an analog control signal. The analog control signal is supplied as regulation voltage $V_{CTRL}$ to a corresponding terminal of the power oscillator 112 for power regulation.

Thus, in the implementation just described, the data stream conveyed through the amplitude modulation OUT, across the galvanic isolation barrier represented by transformer 111, includes n-data channel D1 . . . Dn bits and the power control P bits, thus avoiding the use of, at least, two other isolated links, i.e., one for data transmission and the other for power control feedback, respectively.

Figure 3:
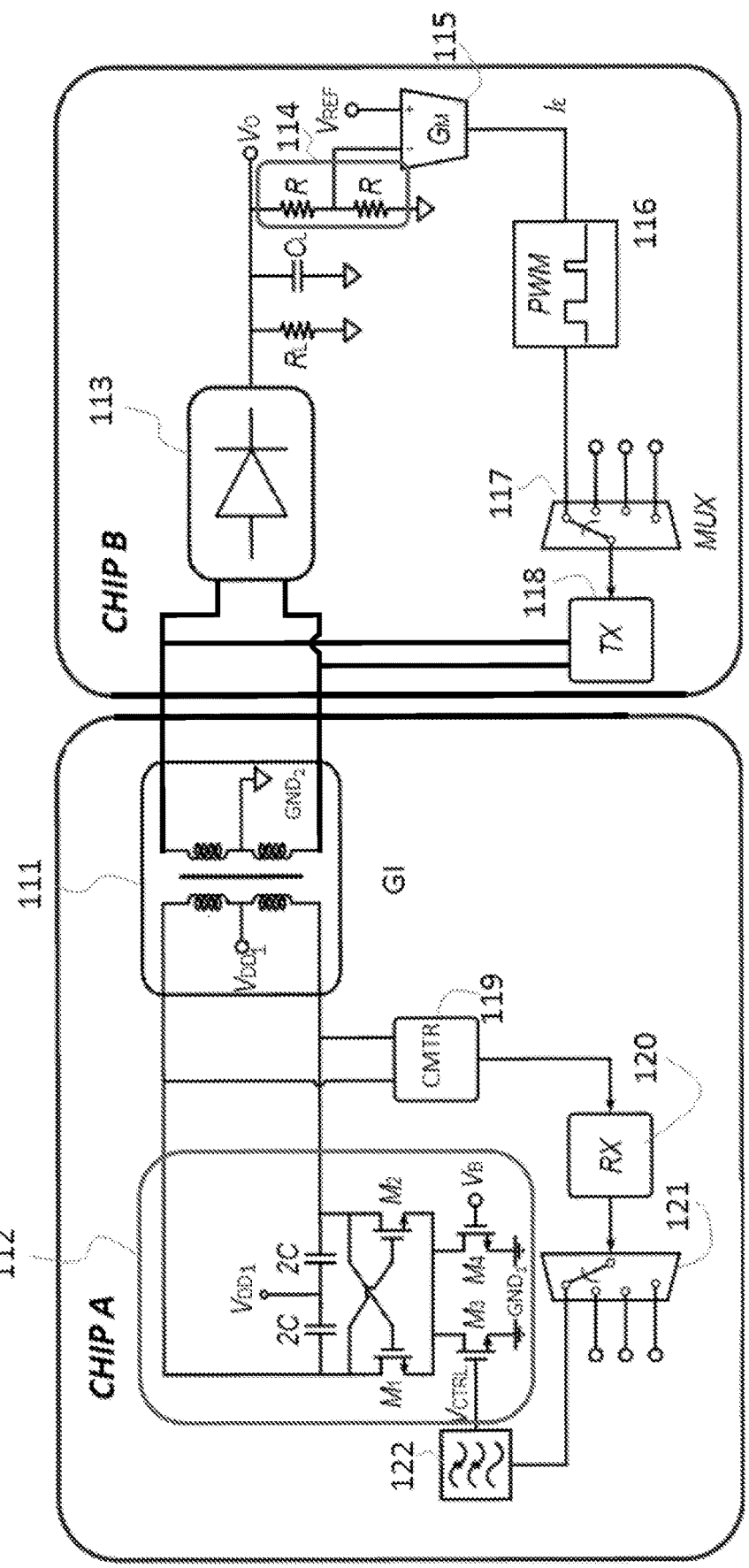
FIG. 3 is a block diagram of an embodiment of a DC-DC converter.

In FIG. 3 is shown schematically an embodiment of the converter circuit 110, in which the transformer 111 is obtained on a first chip, indicated with Chip A (which can be a circuit or an interface, and can be included in the circuit unit 10 as well), on which the power oscillator 112 is also incorporated.

As shown, the isolation transformer 111 includes a central tap of the first winding 111, splitting the first winding 111 in two half-windings. The first half winding is connected to power supply VDD1 on the first chip Chip A. The second half winding is connected to ground $GND_2$ of a second chip Chip B (which can be a circuit or an interface, and can be included in the second circuit unit 12 as well) on which the rectifier 113 is present, to help guarantee a low impedance path for the current injected by CMT events.

FIG. 3 shows an implementation of the analog to digital converter 116, which is embodied by a simple PWM generator, whose output signal, a PWM signal representing the power control value P, is then sampled and multiplexed together with the n channel data D1 . . . Dn. After demultiplexing the received bitstream RBT at demultiplexer 121, a digital to analog conversion is performed on the PWM signal representing the power control value P bits at the digital to analog converter module 122, which is a simple low pass filter, to thereby extract the DC component of the PWM signal, which regulates as per regulation voltage $V_{CTRL}$ at the corresponding regulation terminal of the power oscillator 12, the transmitted power.

The partition circuit 114 is formed by two equal resistors R, splitting the value of the output voltage Vo, while the comparator 115 is a trans-conductance amplifier which supplies as error signal ε an error current $I_\varepsilon$ driving the PWM generator 116.

To help guarantee the data transmission, the carrier signal, i.e., amplitude modulation OUT across the galvanic barrier GI, must be present. For this reason, a D class power oscillator with on/off control cannot be used. As shown, there is an oscillator configured as a power oscillator with a resonant load including two switching MOSFET transistors $M_1$ and $M_2$ connected by a cross-coupled feedback network, and two time delay capacitors 2C, i.e., the oscillator is a power oscillator including a cross-coupled pair. The oscillator is operated at a controlled current. A bias MOSFET $M_4$ is connected between the source of the MOSFETS $M_1$ and $M_2$ and the ground $GND_1$ of the first chip Chip A, providing a minimum bias current for the operation of the oscillator 112 under the control of a bias voltage VB applied to its gate electrode. A MOSFET $M_3$ is then connected between the source of the MOSFETS $M_1$ and $M_2$ and the ground $GND_1$ of the first chip Chip A, and operates as current generator which current is set by the regulation voltage $V_{CTRL}$ received at its gate electrode adjusting the bias current provided by MOSFET $M_4$. This topology also allows a better CMT rejection compared to a D class oscillator.

Summarizing, such topology includes a power oscillator, i.e., components $M_1$, $M_2$, 2C, with the cross coupling of MOSFETS, associated with a circuit, i.e., MOSFETs $M_4$, $M_3$ for regulating the bias of the power oscillator $M_1$, $M_2$, 2C. The bias MOSFET $M_4$ is configured to provide a minimum bias current for the operation of the oscillator 112 under the control of a bias voltage VB and a regulation MOSFET $M_3$ configured to adjust the bias current under the control of the regulation voltage $V_{CTRL}$.

Thus, demultiplexer circuit 121 is used to separate the data streams and extract the signal representing the power control value P bits, which is filtered to extract the DC component which regulates, as regulation voltage $V_{CTRL}$, the power of the oscillator 112 by adjusting the bias current by means of $M_3$.

Figure 4:
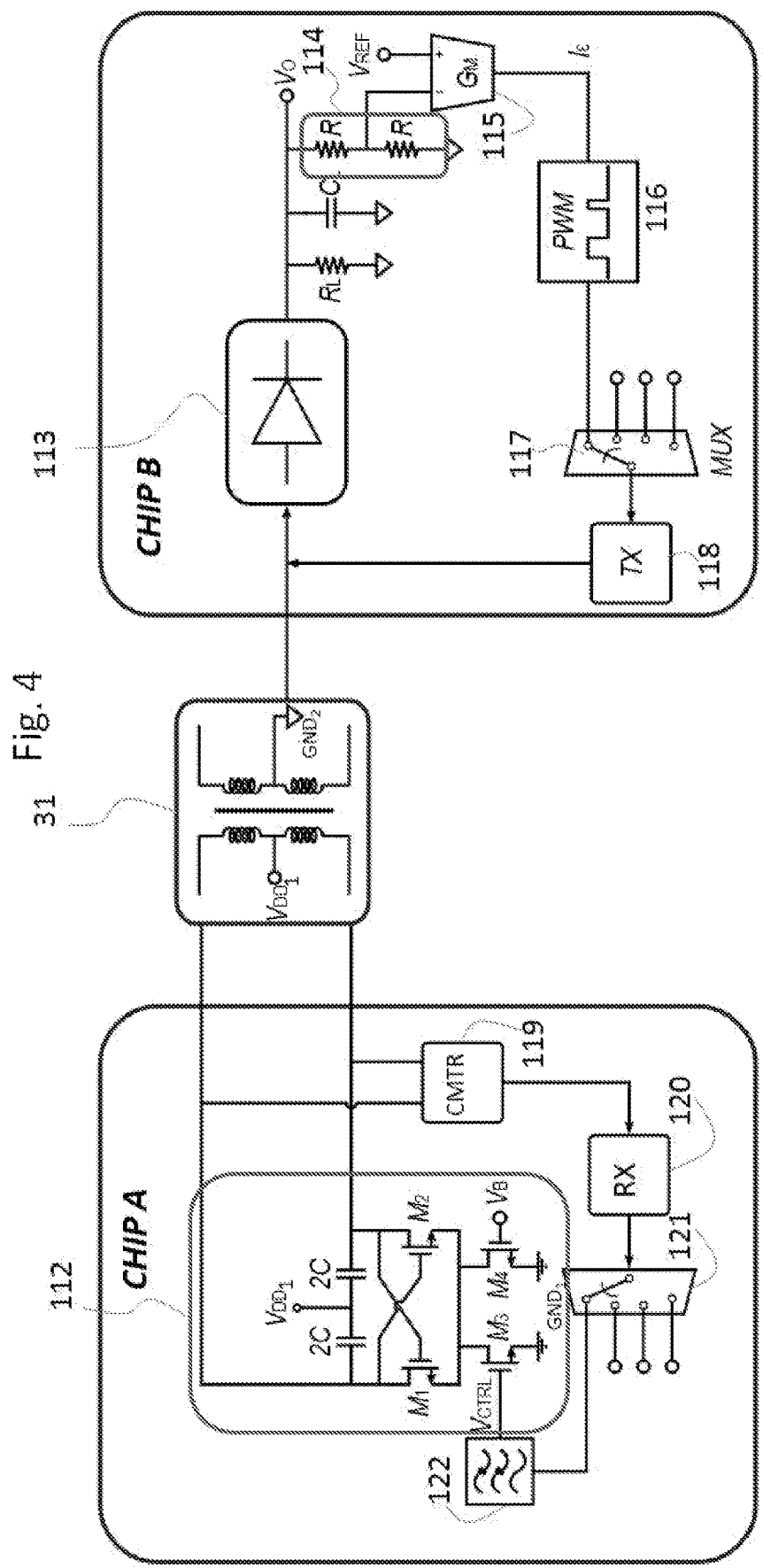
FIG. 4 is a block diagram of an embodiment of a DC-DC converter.

FIG. 4 shows a variant embodiment of the converter 110 in which the isolation transformer 111 is manufactured on a separated chip 31 by a dedicated manufacturing process, in particular by post-processing.

Figure 5:
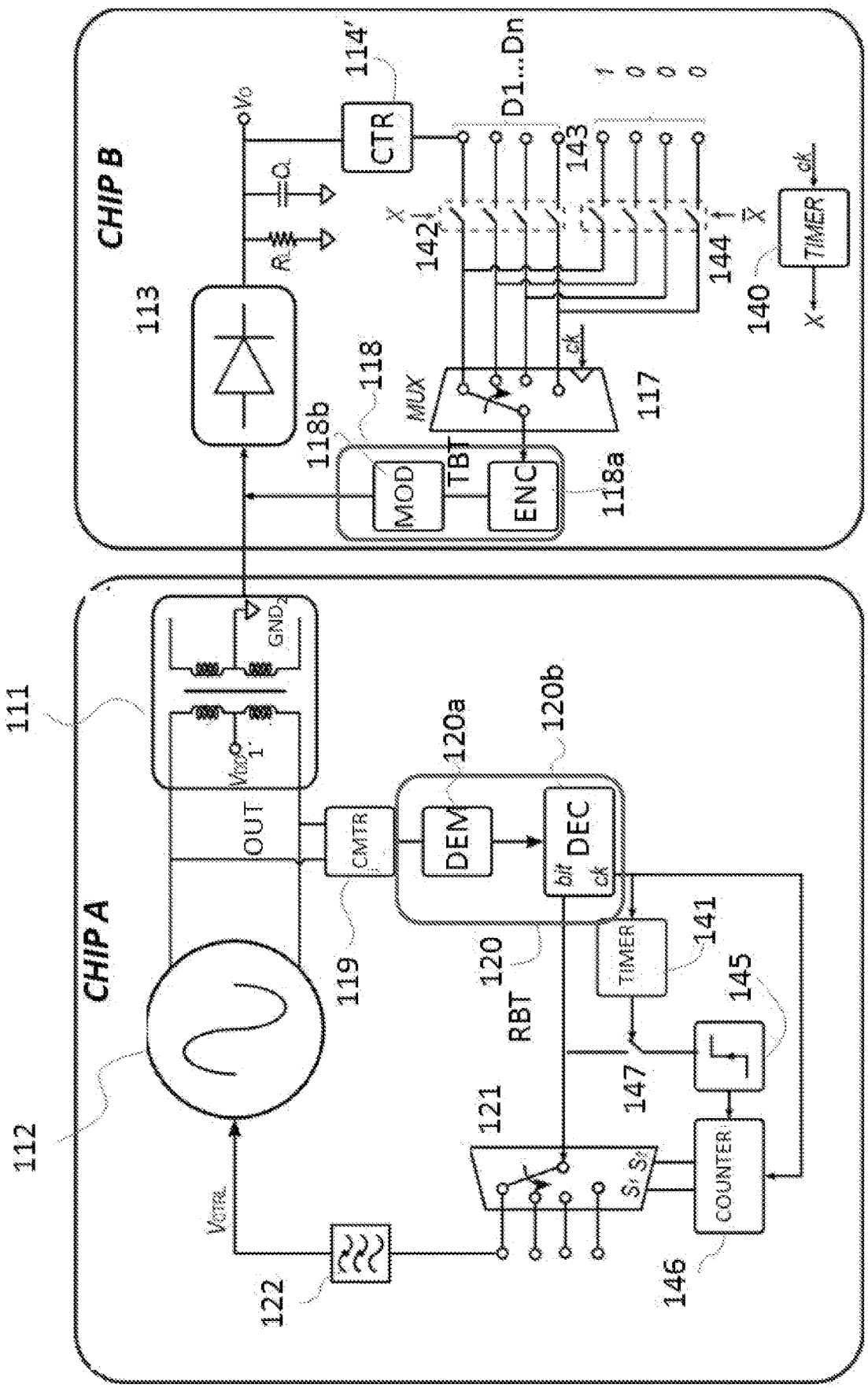
FIG. 5 is a block diagram of an embodiment of a DC-DC converter in operation.

To guarantee a correct reconstruction of the transmitted data signals, the implementation here described provides a start-up training phase for the synchronization between the multiplexer 117 and the demultiplexer 121, which is exemplified with reference to FIG. 5, which details the operation of a converter such as the one of the embodiment shown in FIG. 3, i.e. with the transformer 111 on the first chip Chip A.

A respective switch 142 controlled by a switch signal X is placed between each input of the multiplexer 117 and the corresponding line carrying the power control value P or the data channel D1 . . . Dn. A further plurality of bit carrying lines 143, on which are interposed respective switches 144, controlled by the complement of the switch signal X(bar) feeds to the inputs of the multiplexer 117 logic values, so that the line corresponding to the power control channel, i.e., value P, is set to logical "1", while the data channels D1 . . . Dn are set to logical "0".

A timer module 140 is provided on the second chip Chip B, and is driven by a reference clock signal ck, for instance the main clock of the second chip Chip B. The reference clock signal ck is fed to the clock input of the multiplexer 117. The timer module 140 generates the switch signal X. During the initial start-up training phase, the switch signal X is set to a logical level, for instance logical "0", to open the switches 142 and to close the switches 144, so that bits "1" are transmitted on the control channel while bits "0" are transmitted on the data channels. The timer module 141 defines the duration of the start-up training phase by controlling the duration at which the signal X is at level "0", and during this time interval the clock reference ck is recovered from the receiver 120. Specifically, the first pulse of reference clock ck enables the timer module 140 to set the switch signal X to a low logic level. After a fixed time (for example, after M cycles of the reference clock signal ck) the switch signal X goes to a high logic level and the start-up training phase ends. In particular, as shown in FIG. 5, the transmitter 118 includes an encoder 118a, which is configured to perform an encoding, for instance a Manchester encoding to reduce the Bit Error Rate, feeding the encoded signal to a modulator 118b. The modulator 118b, as mentioned above, applies the corresponding ASK modulation by NMOS switches, which shunt to ground two detuning capacitors, connected to the two ends of the secondary winding 111s. The receiver 120 includes a corresponding demodulator 120a demodulating the amplitude modulation OUT and supplying a demodulated signal to a decoder 120b, performing the decoding, to supply the decoded signal, i.e., the received bitstream RBT, to the demultiplexer 121. As shown, the decoder 120b is also configured to recover the reference clock ck from the demodulated signal. The demultiplexer 121 is driven by the selection inputs $S_i$ (the number of the enable inputs depends on the number of the demultiplexer outputs, in the example of FIG. 5 four outputs have been assumed that involve two enable inputs $S_1$ and $S_2$) generated by a digital counter 146. The digital counter 146 is driven by the reference clock ck, as sampling clock, recovered from the decoder 120b. In this way, the selection inputs $S_1$ and $S_2$ change at each clock pulse to switch the bits RBT on the different output channels of the demultiplexer 121. The recovered reference clock ck drives the timer module 141, that is similar to the timer 140. Specifically, the first pulse of recovered reference clock ck enables the timer module 141 to close the switch 147. After a fixed time (for example, after M cycles of the recovered reference clock signal ck) the switch 147 is opened and the start-up training phase ends. The switch 147 is opened and closed, connecting the bitstream RBT to a rising edge detection circuit 145. A counter 146 is clocked by the reference clock ck and controls the selection input $S_1$ and $S_2$ of the outputs of the demultiplexer 121, making it cycle through its outputs, P, D1 . . . Dn, in sequence. The detection of a rising edge means that the actual bit in the bitstream RBT is the control bit and the counter 146 is immediately reset switching the demultiplexer 121 into the control channel. This happens, during the training phase, where the 10 . . . 0 signal of lines 143 is being transmitted as the transmitted bitstream RBT, thus the counter 146 switches the demultiplexer on the power control channel P every n+1 cycles of the reference clock ck.

When the switch signal X switches, the switches 142 are closed and the switches 144 open, thus conveying the regular bitstream in which are multiplexed the control value P and the data channels D1 ... Dn, while the switch 147 is open, cutting off the edge detector 145 so that the counter 146 cannot be longer reset.

Summarizing in FIG. 5, a switch arrangement 142, 144 is used to feed a given digital value, i.e., 10 ... 0, to the multiplexer 117 under the control of a timing signal, i.e., switch signal X, based on a reference clock signal ck and corresponding switch arrangement, i.e., switch 147. Switch 147 feeds such given digital value to a circuit arrangement, represented by the edge detection circuit 145 and counter 146 performing a reset of the demultiplexer on the basis of the occurrence of the given digital value in the received bitstream, such occurrence being clocked by the reference clock ck, thus synchronizing the multiplexer 117 and demultiplexer 121. The timing signal (X) thus identifies a clock training phase to synchronize the multiplexer 117 and demultiplexer 121.

Note that in FIG. 5, for simplicity a block 114' is shown connected with its input to the output Vo and the output to the switching arrangement 142, such block including blocks 114, 115 and 116 of FIG. 4.

Without prejudice to the underlying principles, the details and the embodiments may vary, even significantly, with respect to what has been disclosed by way of example only in the foregoing, without departing from the extent of protection.

The extent of protection is defined by the annexed claims.

LIST OF REFERENCES CITED IN THE DESCRIPTION

All of the following references are incorporated herein by reference:

[1] S. Marwat, "Digital isolators compliance to IEC 61010-1 edition 3.0 safety requirements," Texas Instruments, White paper, 2014, SLYY055.
[2] B. Chen, "iCoupler® products with isoPower™ technology: signal and power transfer across isolation barrier using microtransformers," Technical Article, Analog Devices, USA.
[3] B. Chen, "High frequency power converter based on transformers," US 2010/0052630 A1, March 2010.
[4] B. Chen, "Fully integrated isolated DC-DC converter using micro transformers," in Proc. IEEE Applied Power Electronics Conference and Exposition, (APEC), pp. 335 338, February 2008.
[5] B. Chen, "Isolated half-bridge gate driver with integrated high-side supply," Proc. IEEE Power Electronics Specialists Conf. (PESC) pp. 3615 3618, June 2008.
[6] V. Palumbo, G. Ghidini, E. Carollo, F. Toia, "Integrated transformer" U.S. patent application Ser. No. 14/733,009, filed Jun. 8, 2015.
[7] F. Pulvirenti, G. Cantone, G. Lombardo, M. Minieri, "Dispositivi con isolamento galvanico integrato (in Italian)", in Convegno Annuale 2014 dalla ricerca all'impresa: necessità di un trasferimento più efficace, Trieste, September 2014.
[8] N. Spina, V. Fiore, P. Lombardo, E. Ragonese, and G. Palmisano, "Current-reuse transformer coupled oscillators with output power combining for galvanically isolated power transfer systems," IEEE Transaction on Circuits and Systems I, vol. 62, pp. 2940 2948, December 2015.
[9] P. Lombardo, V. Fiore, E. Ragonese, G. Palmisano, "A fully-integrated half-duplex data/power transfer system with up to 40 Mbps data rate, 23 mW output power and on-chip 5 kV galvanic isolation," IEEE International Solid-State Circuits Conference (ISSCC), San Francisco, USA, February 2016, pp. 300-301.
[10] N. Greco, N. Spina, V. Fiore, E. Ragonese, and G. Palmisano, "A galvanically isolated DC DC converter based on current-reuse hybrid-coupled oscillators," IEEE Trans. Circuits Syst. II, vol. 64, pp. 56-60, January 2017.
[11] B. Chen, "Microtransformer isolation benefits digital control," Power Electronics Technology, pp. 20 25, October 2008.
[12] E. Ragonese, V. Fiore, N. Spina, P. Lombardo, G. Palmisano, "Power oscillator apparatus with transformer-based power combining for galvanically-isolated bidirectional data communication and power transfer," U.S. Pat. No. 9,306,614 B2, granted 5 Apr. 2016.
[13] Z. Tan et al., "A fully isolated delta-sigma ADC for shunt based current sensing," IEEE Journal of Solid-State Circuits, vol. 51, October 2016.
[14] E. Ragonese, N. Spina, A. Parisi, P. Lombardo, N. Greco, G. Palmisano, "A galvanic isolation circuit, corresponding system and method," IT Patent App. 10201600008820, filed 30 Aug. 2016.
[15] E. Ragonese, N. Spina, P. Lombardo, N. Greco, A. Parisi, G. Palmisano, "A galvanic isolation circuit, corresponding system and method," EU Patent Appl. 17161341.7, filed 16 Mar. 2017.
[16] E. Ragonese, N. Spina, P. Lombardo, N. Greco, A. Parisi, G. Palmisano, "A galvanic isolation circuit, corresponding system and method," U.S. patent application Ser. No. 15/468,306, filed 24 Mar. 2017.

The invention claimed is:

1. A DC-DC converter circuit, comprising:
a single isolation transformer having a primary winding and a secondary winding magnetically coupled to the primary winding to form a magnetic coupling between the primary winding and the secondary winding, wherein the magnetic coupling between the primary winding and the secondary winding is between immediately adjacent portions of the primary winding and the secondary winding;
a power oscillator connected to apply an oscillating signal to the primary winding of the single isolation transformer to thereby transmit a power signal, via the magnetic coupling, from the primary winding to the immediately adjacent portion of the secondary winding;
a rectifier connected to the secondary winding of the single isolation transformer and configured to obtain an output DC voltage by rectification of the power signal at the secondary winding;
comparison circuitry configured to generate an error signal representing a difference between the output DC voltage and a reference voltage value;
a transmitter connected to the secondary winding of the single isolation transformer to apply an amplitude modulation to the power signal at the secondary winding of the single isolation transformer in response to the error signal to thereby produce, via the magnetic coupling, an amplitude modulated signal at the immediately adjacent portion of the primary winding; and
a receiver and control circuit connected to the primary winding and configured to control an amplitude of the oscillating signal as a function of the amplitude modulated signal.

2. The DC-DC converter circuit of claim 1, wherein the secondary winding comprises first and second coils directly electrically connected in series.

3. The DC-DC converter circuit of claim 1, further comprising a common mode transient (CMT) rejection circuit connected between the primary winding and the receiver and control circuit, the CMT rejection circuit configured to reduce effects of common mode transients in the amplitude modulated signal.

4. The DC-DC converter circuit of claim 3, wherein the CMT rejection circuit comprises:
- a first n-channel transistor having a drain coupled to a first node, a source coupled to a second node, and a gate coupled to the primary winding;
- a second n-channel transistor having a drain coupled to a third node, a source coupled to the second node, and a gate coupled to the primary winding;
- a resistance coupled between the first node and the third node;
- a capacitance coupled between the first node and the third node;
- an inductance coupled between the first node and the third node; and
- a tail coupled between the second node and ground;
- wherein a tap of the capacitance and a tap of the inductance are coupled to a supply voltage; and
- wherein the first node and the third node are coupled to the receiver.

5. The DC-DC converter circuit of claim 4, wherein the tail comprises a current sink.

6. The DC-DC converter circuit of claim 1, wherein the single isolation transformer is integrated within a dedicated stand-alone chip.

7. The DC-DC converter circuit of claim 1, wherein the single isolation transformer is within a same chip as the power oscillator.

8. The DC-DC converter circuit of claim 1, wherein the single isolation transformer consists of the primary winding and the secondary winding, wherein the secondary winding is magnetically coupled to the primary winding.

9. A DC-DC converter circuit, comprising:
- a single isolation transformer having a primary winding and a secondary winding magnetically coupled to the primary winding to form a magnetic coupling between the primary winding and the secondary winding, wherein the secondary winding has first and second terminals;
- a power oscillator connected to apply an oscillating signal to the primary winding of the single isolation transformer to thereby transmit a power signal, via the magnetic coupling, to the secondary winding;
- a rectifier connected to the secondary winding of the single isolation transformer and configured to obtain an output DC voltage by rectification of the power signal at the secondary winding;
- comparison circuitry configured to generate an error signal representing a difference between the output DC voltage and a reference voltage value;
- a transmitter has first and second terminals, the first terminal of the transmitter being directly electrically connected to the first terminal of the secondary winding, the second terminal of the transmitter being directly electrically connected to the second terminal of the secondary winding, the transmitter to apply an amplitude modulation to the power signal at the secondary winding of the single isolation transformer in response to the error signal to thereby produce, via the magnetic coupling, an amplitude modulated signal at the primary winding; and
- a receiver and control circuit connected to the primary winding and configured to control an amplitude of the oscillating signal as a function of the amplitude modulated signal.

10. A DC-DC converter circuit, comprising:
- a single isolation transformer having a primary winding and a secondary winding magnetically coupled to the primary winding to form a magnetic coupling between the primary winding and the secondary winding, wherein the primary winding has first and second terminals;
- a power oscillator connected to apply an oscillating signal to the primary winding of the single isolation transformer to thereby transmit a power signal, via the magnetic coupling, to the secondary winding;
- a rectifier connected to the secondary winding of the single isolation transformer and configured to obtain an output DC voltage by rectification of the power signal at the secondary winding;
- comparison circuitry configured to generate an error signal representing a difference between the output DC voltage and a reference voltage value;
- a transmitter connected to the secondary winding of the single isolation transformer to apply an amplitude modulation to the power signal at the secondary winding of the single isolation transformer in response to the error signal to thereby produce, via the magnetic coupling, an amplitude modulated signal at the primary winding; and
- a receiver and control circuit connected to the primary winding and configured to control an amplitude of the oscillating signal as a function of the amplitude modulated signal, wherein the receiver and control circuit has first and second terminals, wherein the first terminal of the receiver and control circuit is directly electrically connected to the first terminal of the primary winding, and the second terminal of the receiver and control circuit is directly electrically connected to the second terminal of the primary winding.

11. A DC-DC converter circuit, comprising:
- a single isolation transformer having a primary winding and a secondary winding magnetically coupled to the primary winding to form a magnetic coupling between the primary winding and the secondary winding;
- a power oscillator connected to apply an oscillating signal to the primary winding of the single isolation transformer to thereby transmit a power signal, via the magnetic coupling, to the secondary winding;
- a rectifier connected to the secondary winding of the single isolation transformer and configured to obtain an output DC voltage by rectification of the power signal at the secondary winding;
- comparison circuitry configured to generate an error signal representing a difference between the output DC voltage and a reference voltage value;
- a transmitter connected to the secondary winding of the single isolation transformer to apply an amplitude modulation to the power signal at the secondary winding of the single isolation transformer in response to the error signal to thereby produce, via the magnetic coupling, an amplitude modulated signal at the primary winding; and
- a receiver and control circuit connected to the primary winding and configured to control an amplitude of the oscillating signal as a function of the amplitude modulated signal;

a de-multiplexing circuit coupled to the receiver and control circuit and configured to produce, based upon the amplitude modulated signal, n-data channels representing data transmitted by the transmitter, wherein n is non-zero.

12. The DC-DC converter circuit of claim 11, wherein one of the n-data channels is a power control bit stream responsive to a difference between the output DC voltage and a reference signal.

13. The DC-DC converter circuit of claim 12, further comprising a digital to analog converter configured to convert the power control bit stream to a regulation voltage for the power oscillator; and wherein the power signal transmitted by the power oscillator is based upon the regulation voltage.

14. The DC-DC converter circuit of claim 13, further comprising an analog to digital converter configured to convert the error signal to a power control value, and a multiplexer receiving as input the power control value and data to be transmitted and to output therefrom a stream of data as the power control value and data to be transmitted from the transmitter to the receiver in a multiplexed fashion.

15. The DC-DC converter circuit of claim 14, further comprising:
a switch arrangement to feed a given digital value to the multiplexer under control of a timing signal based on a reference clock signal; and
a corresponding switch arrangement to feed the given digital value to a circuit arrangement performing a reset of the de-multiplexing circuit based upon occurrence of the given digital value in the stream of data, the timing signal identifying a clock training phase to synchronize the multiplexer and demultiplexer.

16. The DC-DC converter circuit of claim 14, wherein the analog to digital converter comprises a pulse width modulation (PWM) generator generating a PWM output signal that is sampled and multiplexed with the stream of data.

17. The DC-DC converter circuit of claim 16, wherein the digital to analog converter comprises a filter configured to extract a DC component from the PWM output signal, the DC component serving to regulate power transmitted by the power oscillator.

18. A DC-DC converter circuit, comprising:
a single isolation transformer having a primary winding and a secondary winding magnetically coupled to the primary winding to form a magnetic coupling between the primary winding and the secondary winding;
a power oscillator connected to apply an oscillating signal to the primary winding of the single isolation transformer to thereby transmit a power signal, via the magnetic coupling, to the secondary winding;
wherein the power oscillator comprises:
a cross-coupled pair of transistors connected to a bias regulating circuit for regulating biasing of the cross-coupled pair of transistors, the bias regulating circuit including a bias MOSFET configured to provide a bias current for operation of the power oscillator under control of a bias voltage and a regulation MOSFET configured to adjust the bias current;
a rectifier connected to the secondary winding of the single isolation transformer and configured to obtain an output DC voltage by rectification of the power signal at the secondary winding;
comparison circuitry configured to generate an error signal representing a difference between the output DC voltage and a reference voltage value;
a transmitter connected to the secondary winding of the single isolation transformer to apply an amplitude modulation to the power signal at the secondary winding of the single isolation transformer in response to the error signal to thereby produce, via the magnetic coupling, an amplitude modulated signal at the primary winding; and
a receiver and control circuit connected to the primary winding and configured to control an amplitude of the oscillating signal as a function of the amplitude modulated signal.

19. A DC-DC converter circuit, comprising:
an isolation transformer having a primary winding and a secondary winding magnetically coupled to the primary winding;
wherein the primary winding comprises first and second primary coils directly electrically connected in series, with a tap between the first and second primary coils being coupled to a supply voltage;
wherein the secondary winding comprised first and second secondary coils directly electrically connected in series, with a tap between the first and second secondary coils being coupled to a ground voltage;
a power oscillator connected to apply an oscillating signal to the primary winding of the isolation transformer to thereby transmit a power signal to the secondary winding;
a rectifier connected to the secondary winding of the isolation transformer and configured to obtain an output DC voltage by rectification of the power signal at the secondary winding;
comparison circuitry configured to generate an error signal representing a difference between the output DC voltage and a reference voltage value;
a transmitter connected to the secondary winding of the isolation transformer to apply an amplitude modulation to the power signal at the secondary winding of the isolation transformer in response to the error signal to thereby produce an amplitude modulated signal at the primary winding; and
a receiver and control circuit connected to the primary winding and configured to control an amplitude of the oscillating signal as a function of the amplitude modulated signal; and
a de-multiplexing circuit coupled to the receiver and control circuit, and configured to produce, based upon the amplitude modulated signal, n-data channels representing data transmitted by the transmitter;
wherein one of the n-data channels is a power control bit stream responsive to a difference between the output DC voltage and a reference signal, wherein n is non-zero.

20. The DC-DC converter circuit of claim 19, further comprising, a common mode transient (CMT) rejection circuit connected between the primary winding and the receiver and control circuit, the CMT rejection circuit configured to reduce effects of common mode transients in the amplitude modulated signal, the CMT rejection circuit comprising:
a first transistor having a first conduction terminal coupled to a first node, a second conduction terminal coupled to a second node, and a control terminal coupled to the primary winding;
a second transistor having a first conduction terminal coupled to a third node, a second conduction terminal coupled to the second node, and a control terminal coupled to the primary winding;

a resistance coupled between the first node and the third node;
a capacitance coupled between the first node and the third node;
an inductance coupled between the first node and the third node; and
a tail coupled between the second node and ground;
wherein a tap of the capacitance and a tap of the inductance are coupled to a supply voltage;
wherein the first node and the third node are coupled to the receiver; and
wherein the tail comprises a current sink.

21. The DC-DC converter circuit of claim 19, further comprising:
a digital to analog converter configured to convert the power control bit stream to a regulation voltage for the power oscillator, wherein the power signal transmitted by the power oscillator is based upon the regulation voltage; and
an analog to digital converter configured to convert the error signal to a power control value, and a multiplexer receiving as input the power control value and data to be transmitted and to output therefrom a stream of data as the power control value and data to be transmitted from the transmitter to the receiver in a multiplexed fashion.

22. The DC-DC converter circuit of claim 19, wherein the isolation transformer is integrated within a dedicated stand-alone chip.

23. The DC-DC converter circuit of claim 19, wherein the isolation transformer is within a same chip as the power oscillator.

24. The DC-DC converter circuit of claim 19, wherein the power oscillator comprises a cross-coupled pair of transistors connected to a bias regulating circuit for regulating biasing of the cross-coupled pair of transistors.

25. The DC-DC converter circuit of claim 19, wherein the isolation transformer consists of a primary winding and a secondary winding, the secondary winding being magnetically coupled to the primary winding.

* * * * *